(12) United States Patent
Inagaki (10) Patent No.: US 6,960,516 B1
(45) Date of Patent: Nov. 1, 2005

(54) SEMICONDUCTOR DEVICE AND FABRICATION PROCESS THEREOF

(75) Inventor: Satoshi Inagaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/981,556

(22) Filed: Nov. 5, 2004

(30) Foreign Application Priority Data

Aug. 25, 2004 (JP) .............................. 2004-245509

(51) Int. Cl.[7] .......................................... H01L 21/3205

(52) U.S. Cl. ...................... 438/592; 438/197; 438/652

(58) Field of Search ............................... 438/197, 592, 438/652

(56) References Cited

U.S. PATENT DOCUMENTS 6,475,893 B2 * 11/2002 Giewont et al. ............ 438/586

FOREIGN PATENT DOCUMENTS

JP         2002-334850         11/2002

* cited by examiner

*Primary Examiner*—Jack Chen
(74) *Attorney, Agent, or Firm*—Westerman, Hattori, Daniels & Adrian, LLP (57) ABSTRACT

A method of fabricating a semiconductor device includes the steps depositing a metal film on a silicon substrate so as to cover a polysilicon gate electrode and a diffusion region on the silicon substrate, forming a silicide layer by causing a reaction between a surface of the polysilicon gate electrode and the metal film and between a surface of the diffusion region and the metal film, and removing the metal film after the step of forming the silicide layer, wherein there is provided, before the deposition step of the metal film, a step of removing a native oxide film from a surface of the polysilicon gate electrode and a surface of the diffusion region, and wherein there is provided, after the step of removing the native oxide film, the step of forming a chemical oxide film on the surface of the polysilicon gate electrode and the surface of the diffusion region.

5 Claims, 10 Drawing Sheets

SEMICONDUCTOR DEVICE AND FABRICATION PROCESS THEREOF

CROSS-REFERENCE TO RELATED APPLICATION

The present application is based on Japanese priority application No. 2004-245509 filed on Aug. 25, 2004, the entire contents of which are hereby incorporated by reference.

BACKGROUND OF THE INVENTION

The present invention generally relates to semiconductor devices and more particularly to the fabrication of a high-speed semiconductor device having a silicide film.

The technology of self-aligned silicide (salicide) is a technology of forming a low-resistance silicide layer on the surface of a diffusion region formed on a silicon substrate or on the surface of a polysilicon gate electrode. The salicide process is an indispensable technology in the fabrication of modern high-speed semiconductor devices including logic devices and memory devices.

In salicide technology, a metal film of Co or Ni is deposited on a silicon substrate so as to cover the diffusion region or the polysilicon gate electrode, and a reaction process is conducted thereafter for causing the metal film to react with the surface of the diffusion region or the surface of the polysilicon gate electrode. As a result, there is formed an extremely thin silicide film on the surface of the diffusion region or the surface of the polysilicon gate electrode.

In conventional high-speed semiconductor devices, titanium silicide has been used extensively for such a silicide film, while in recent, ultrahigh-speed semiconductor devices having the gate length of 90 nm or less, cobalt silicide or nickel silicide is used commonly in view of the possibility of reducing the thermal annealing temperature at the time of the silicide formation reaction.

With such salicide technology, it has been generally thought important to remove impurity, particularly native oxide film, from the surface of the diffusion region or from the surface of the polysilicon gate electrode prior to the deposition of the metal film.

(Patent Reference 1) Japanese Laid-Open Patent Application 2002-334850

SUMMARY OF THE INVENTION

In general, and in the salicide technology also, removal of such native oxide film has been achieved by treating the silicon substrate already formed with a device structure therein, in a diluted hydrofluoric acid solution. As a result of such a treatment, not only the native oxide film is removed from the silicon surface, but there is achieved also an advantageous effect that the fresh silicon surface thus exposed after removal of the native oxide film is stabilized by hydrogen termination. Thereby, adsorption of impurity to the exposed silicon surface is effectively suppressed.

On the other hand, the inventor of the present invention has discovered, in the experiment of processing recent ultrahigh-speed semiconductor devices having the gate length of 90 nm or less, such as the one having the gate length of 50 nm, that there tends to be caused non-uniform formation of native oxide film after the process of removing the native oxide film has been conducted by the hydrofluoric acid treatment in advance to the commencement of the salicide process.

It is believed that this problem has been caused under the situation that the concentration of the impurity element such as arsenic (As), phosphorous (P) or boron (B) introduced into the diffusion region is increased in recent ultrahigh speed semiconductor devices for reducing the source resistance and that the depth of the diffusion region is reduced. Thereby, there is caused an increase of concentration of the impurity element at the surface of the diffusion region, and the impurity elements are exposed at the surface of the diffusion region with high surface density. It should be noted that there is caused no hydrogen termination at such part where the impurity element is exposed when the treatment in hydrofluoric acid is conducted.

Thus, in the part of the silicon surface where the hydrogen termination is not caused, there tends to occur bonding of oxygen, while such bonding of oxygen causes non-uniform formation of native oxide film after the hydrofluoric acid treatment.

Figure 1:
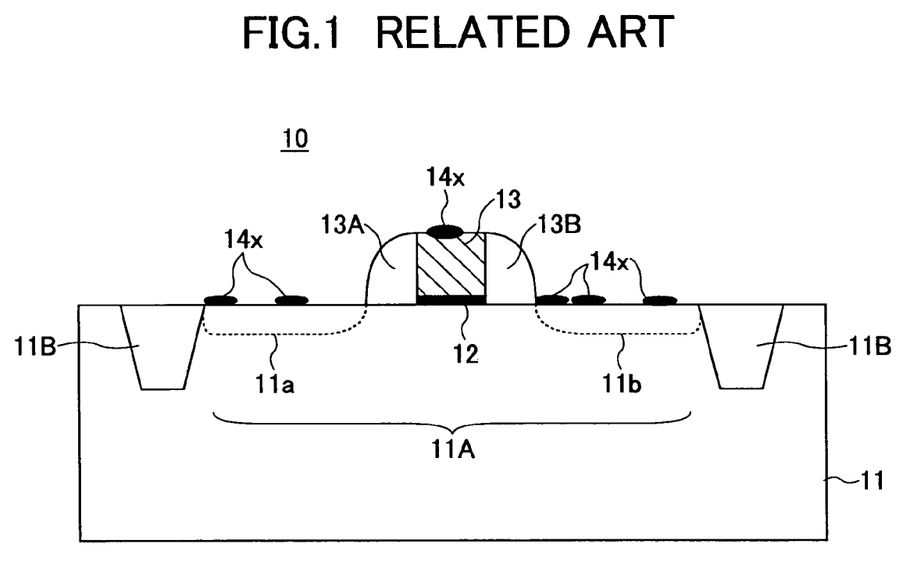
FIG. 1 is a diagram explaining the problems in the related art.

FIG. 1 shows such a non-uniform formation of native oxide film caused in an ultrahigh-speed semiconductor device 10 after the process for removal of the native oxide film in a hydrofluoric acid bath.

Referring to FIG. 1, the semiconductor device 10 is formed on a device region 11A defined in a silicon substrate 11 by a device isolation structure 11B of the STI type, wherein the semiconductor device 10 includes a polysilicon gate electrode 13 formed on the device region 11A in correspondence to a channel region of the semiconductor device 10 via a gate insulation film 12.

Further, on both sidewall surfaces of the polysilicon gate electrode 13, there are formed sidewall insulation films 13A and 13B, and diffusion regions 11a and 11b are formed in the silicon substrate 11 at respective outer sides of the sidewall insulation films 13A and 13B.

For example, the diffusion regions 11a and 11b are doped to the n+-type, and the polysilicon gate electrode 13 is doped to the same conductivity type as the diffusion regions 11a and 11b for the purpose of threshold control.

As explained previously, the native oxide film is removed from the surface of the diffusion regions 11a and 11b or from the surface of the polysilicon gate electrode 13 as a result of treatment of the silicon substrate 11 in the diluted hydrofluoric acid bath, while there is caused poor hydrogen termination at the surface of the diffusion regions 11a and 11b or at the surface of the polysilicon gate electrode 13 because of existence of the impurity element doped with high concentration at these surface parts. Thus, once the substrate 11 is held in the air after the treatment in the hydrofluoric acid bath, there occurs non-uniform formation of native oxide film 14x in the device structure 10 as represented in FIG. 1.

When a metal film is deposited in such a state and reaction is made with the silicon surface, there inevitably occurs non-uniform formation of silicide, while such non-uniform formation of silicide can lead to the problem of increase of contact resistance or increase of variation of the contact resistance in the case an electrode such as the source electrode, drain electrode or the gate contact electrode is formed.

In an aspect of the present invention, there is provided a method of fabricating a semiconductor device including a self-aligned silicide formation process, comprising the steps of:

forming a device structure including a polysilicon gate and a diffusion region on a silicon substrate;

depositing a metal film on said silicon substrate so as to cover said polysilicon gate electrode and said diffusion region;

forming a silicide layer by causing a reaction between a surface of said polysilicon gate electrode and said metal film and between a surface of said diffusion region and said metal film; and removing said metal film after said step of forming said silicide layer;

wherein there is provided, before said deposition step of said metal film, the step of removing a native oxide film from a surface of said polysilicon gate electrode and a surface of said diffusion region, and wherein there is provided, after said step of removing said native oxide film, the step of forming a chemical oxide film on said surface of said polysilicon gate electrode and said surface of said diffusion region.

According to the present invention, it becomes possible to form a uniform silicide film on the surface of the polysilicon gate electrode and on the surface of the diffusion region in the silicide formation step conducted subsequently to the metal film formation step.

Particularly, by conducting the chemical oxide film formation step after the step of removing the native oxide film, without exposing the silicon substrate to the atmosphere, the problem of non-uniform formation of native oxide film on these silicon surfaces is successfully eliminated even in the case the diffusion region or the polysilicon gate electrode is doped by an impurity element with high concentration. Because the chemical oxide film has a very small thickness (0.5–0.6 nm), the metal element in the metal film reaches easily the silicon surface in the foregoing silicide formation step through the chemical oxide film, leading to the desired silicide formation. Thereby, a silicide film having a uniform thickness is obtained.

In another aspect, the present invention provides a semiconductor device, comprising:

a silicon substrate;

a polysilicon gate electrode formed on a surface of said silicon substrate via a gate insulation film; and diffusion regions formed in said silicon substrate at both lateral sides of said polysilicon gate electrode, wherein there is formed a chemical oxide film on a surface of said diffusion region and on a surface of said gate electrode.

In another aspect, the present invention provides a semiconductor substrate defined with plural device regions, wherein there is formed a semiconductor device structure of any of the foregoing on each of the plural device regions.

According to the present invention, the reactive silicon surface of the semiconductor structure is covered with the stable chemical oxide film, and handling of the semiconductor substrate is facilitated substantially. For example, formation of non-uniform native oxide film is successfully eliminated even when the semiconductor substrate is taken to the air, and thus, it becomes possible to transport the semiconductor substrate through the atmospheric ambient. Particularly, by forming a metal film on such a chemical oxide film, it becomes possible to carry out transportation of the semiconductor substrate in the air.

Other objects and further features of the present invention will become apparent from the following detailed description when read in conjunction with the attached drawings.

DETAILED DESCRIPTION OF THE INVENTION

Figure 2A:
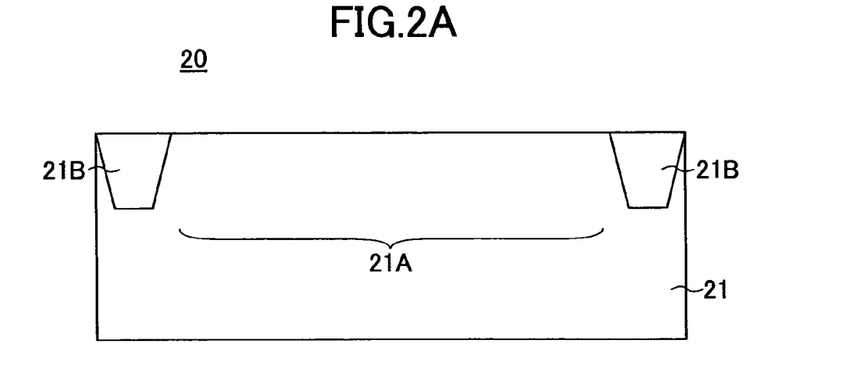
FIGS. 2A–2G are diagrams explaining the fabrication process of a semiconductor device according to an embodiment of the present invention.
Figure 2B:
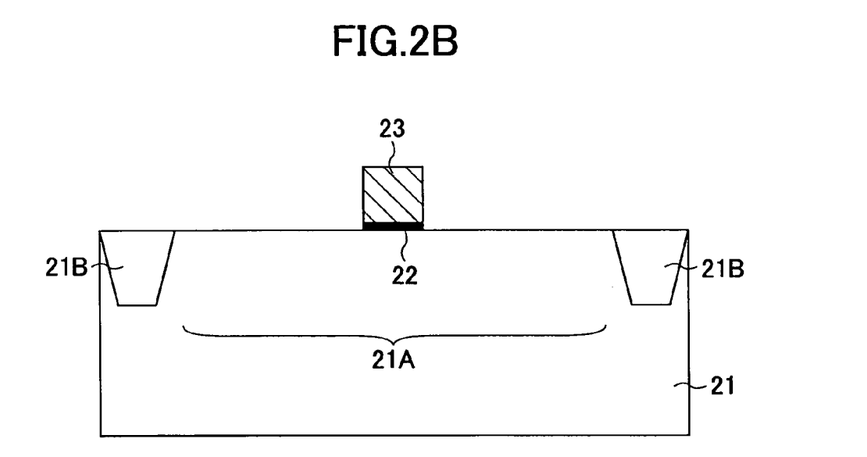

FIGS. 2A–2G are diagrams showing the fabrication process of an n-channel MOS transistor according to an embodiment of the present invention;

Referring to FIG. 2A, there is defined a device region 21A on a silicon substrate 21 by an STI device isolation region 21B, and a polysilicon gate electrode 23 is formed on the device region 21A via a gate insulation film 22 in the step of FIG. 2B in correspondence to a predetermined channel region. In the illustrated example, the polysilicon gate electrode 23 has a gate length of 50 nm.

In the step of FIG. 2B, it should be noted that the gate electrode 23 is actually formed on the structure of FIG. 2A by forming an SiON film with the thickness of about 2 nm, followed by deposition of a polysilicon film, and further by patterning the polysilicon film and the underlying SiON film by electron beam lithography, or the like.

Figure 2C:
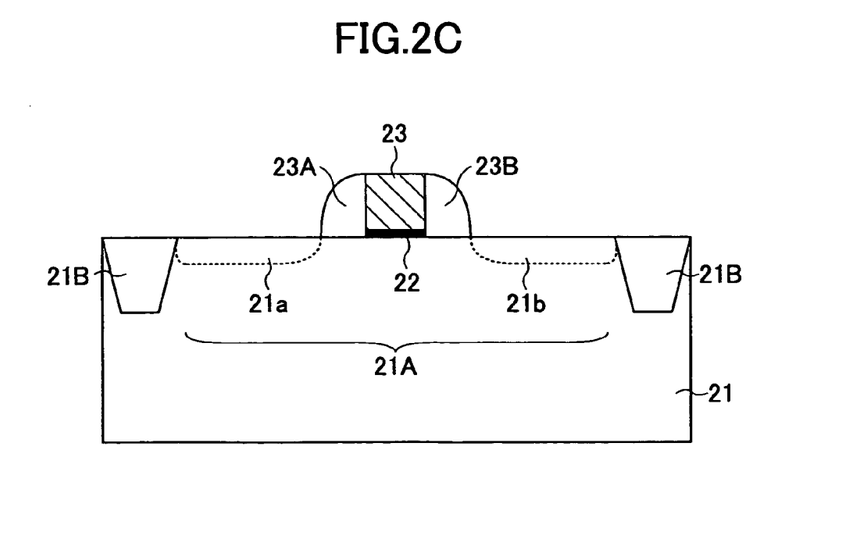

Next, in the step of FIG. 2C, sidewall insulation films 23A and 23B are formed on both sidewall surfaces of the gate electrode 23, and n+-type diffusion regions 21a and 21b are formed in the device region 21A at respective outer sides of the sidewall insulation films 23A and 23B by ion implantation of an n-type impurity element such as As+ or P+ as the source and drain regions of the MOS transistor 20. Further, while not illustrated, there are formed source and drain extension regions of n-type in the device region 21 respectively at both lateral sides of the gate electrode 23 right underneath the sidewall insulation films 23A and 23B as an extension of the n+-type diffusion regions 21a and 21b. Further, in the step of FIG. 2C, the polysilicon gate electrode 23 is doped to the n+-type simultaneously to the formation of the n+-type diffusion regions 23a and 23b. Such ion implantation process is typically conducted under the acceleration voltage of 10 keV with the dose of $1\times10^{10}$ cm$^{-2}$ in the case P+ is used for the n-type impurity element.

Figure 2D:
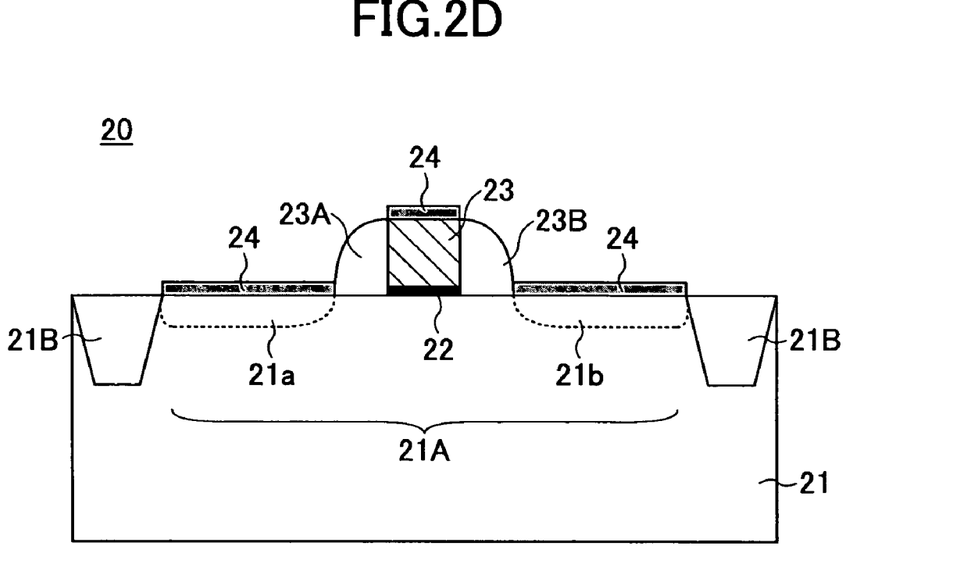
Figure 3A:
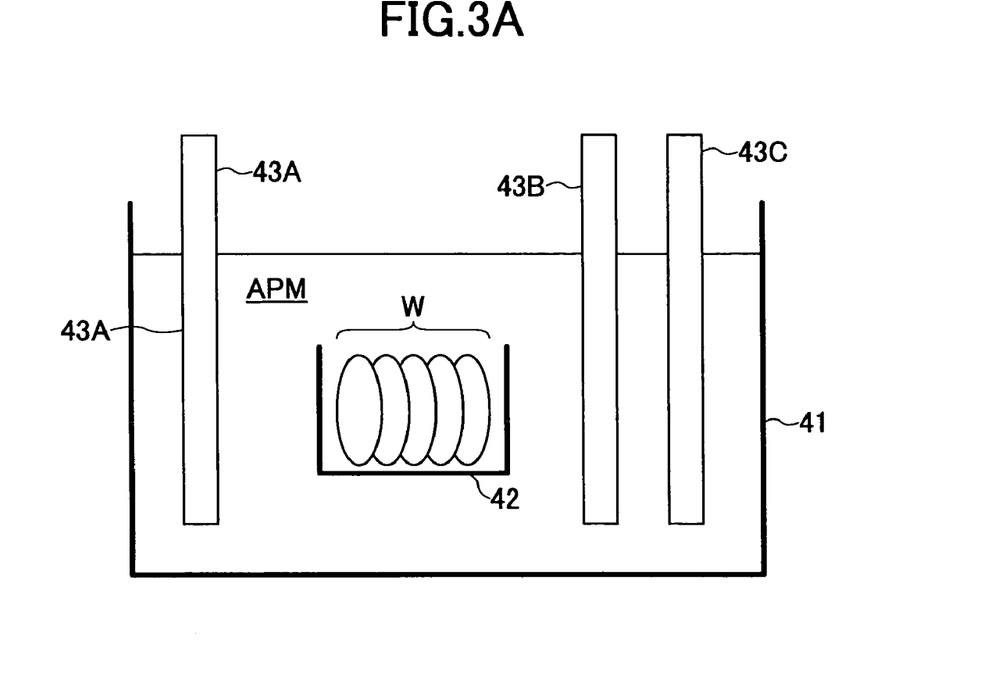
FIGS. 3A–3E are diagrams explaining the process conducted between FIGS. 2C and 2D.

Next, in the step of FIG. 2D, the structure of FIG. 2C is introduced into a wet processing bath 41 of FIG. 3A holding therein an aqueous solution of APM, which is a mixture of ammonia and hydrogen peroxide. As a result, there is formed a chemical oxide film on the surface of the silicon substrate 21, particularly on the surface of the diffusion regions 21a and 21b and the surface of the gate electrode 23, in addition to the non-uniform native oxide film explained with reference to FIG. 1.

Referring to FIG. 3A, it can be seen that a silicon wafer W formed with the structure of FIG. 2C is immersed in the APM solution in the wet processing bath 41 in the state that the wafer W is held in a container 42, wherein the wet processing is conducted at a temperature equal to or higher than the room temperature, preferably at the temperature of 60–80° C. Typically, the ratio of ammonia and hydrogen peroxide is set to 1:1.

Figure 3B:
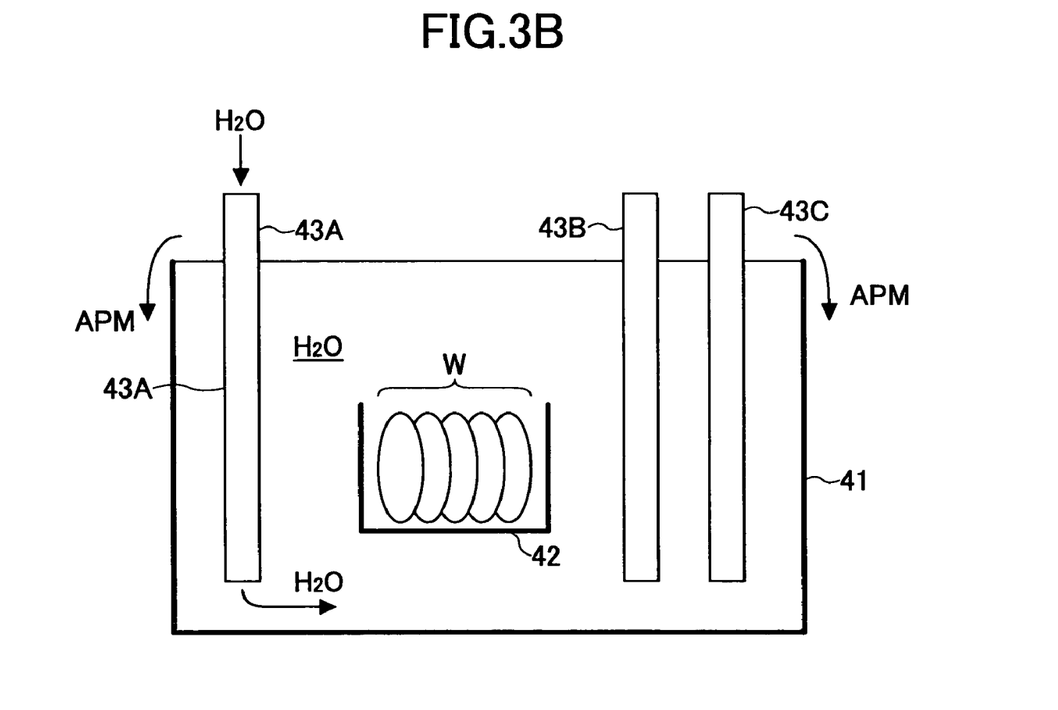

After the step of formation of the chemical oxide film of FIG. 3A, a purified water is supplied to the wet processing bath 41 from a port 43A in the step of FIG. 3B in the state the container and the wafer W are held in the bath 41, wherein the APM aqueous solution in the bath 41 is purged from the bath by overflowing. With this, the liquid in the bath 41 is replaced with the purified water.

Figure 3C:
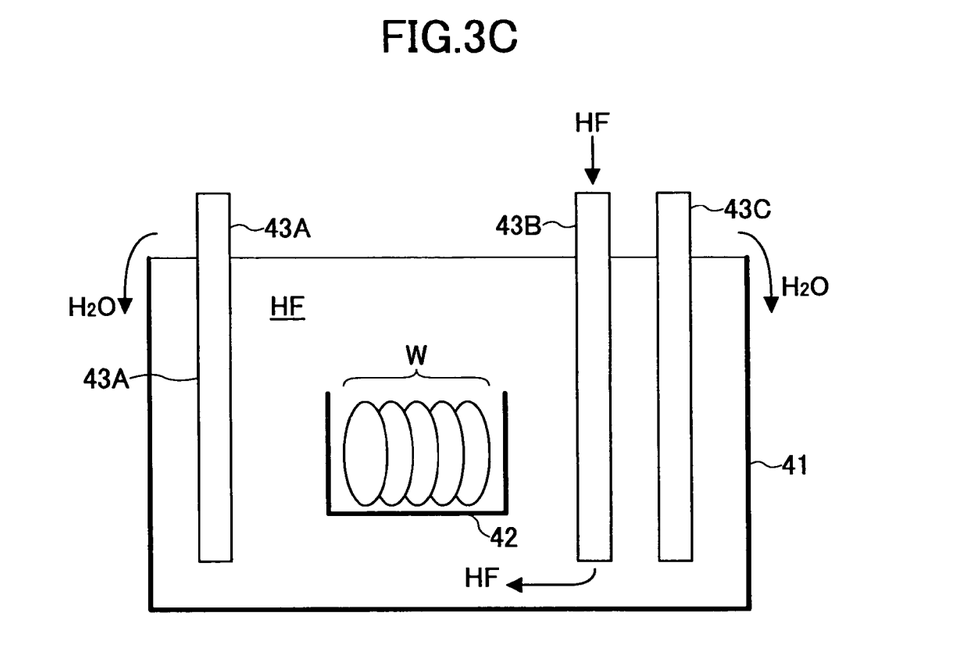

Further, in the step of FIG. 3C, an aqueous solution of diluted HF is supplied to the wet processing bath 41 from another port 43B while holding the container 42 and the wafer W in the bath 41, such that the purified water is purged from the bath 41 by causing overflowing. With this the liquid in the bath is replaced with the diluted HF aqueous solution.

As a result of the wet processing of FIG. 3C, the native oxide film and the chemical oxide film are removed by etching, and a fresh silicon surface is exposed at the diffusion regions 21a and 21b and at the polysilicon gate electrode 23. The wet etching process of FIG. 3C is conducted under the condition that would cause a wet etching of a thermal oxide film with the depth of about 5 nm.

Figure 3D:
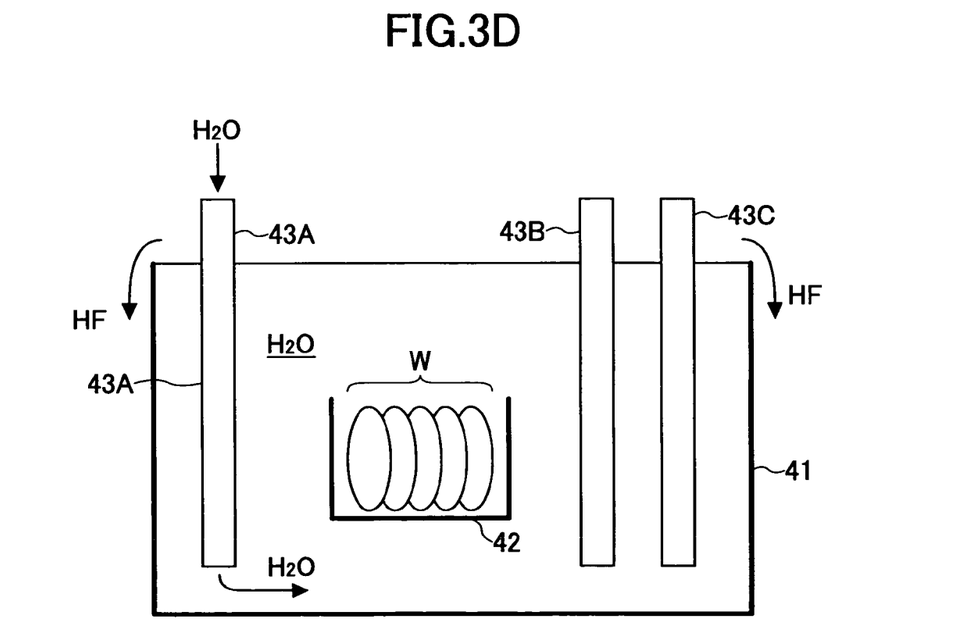

After the etching process of FIG. 3C, a purified water is supplied to the wet processing bath 41 in the step of FIG. 3D in the state that the container 42 and the wafer W are held in the bath 41, such that the diluted HF aqueous solution is purged from the bath 41 by causing overflowing. With this, the liquid in the container 41 is replaced again with the purified water.

Figure 3E:
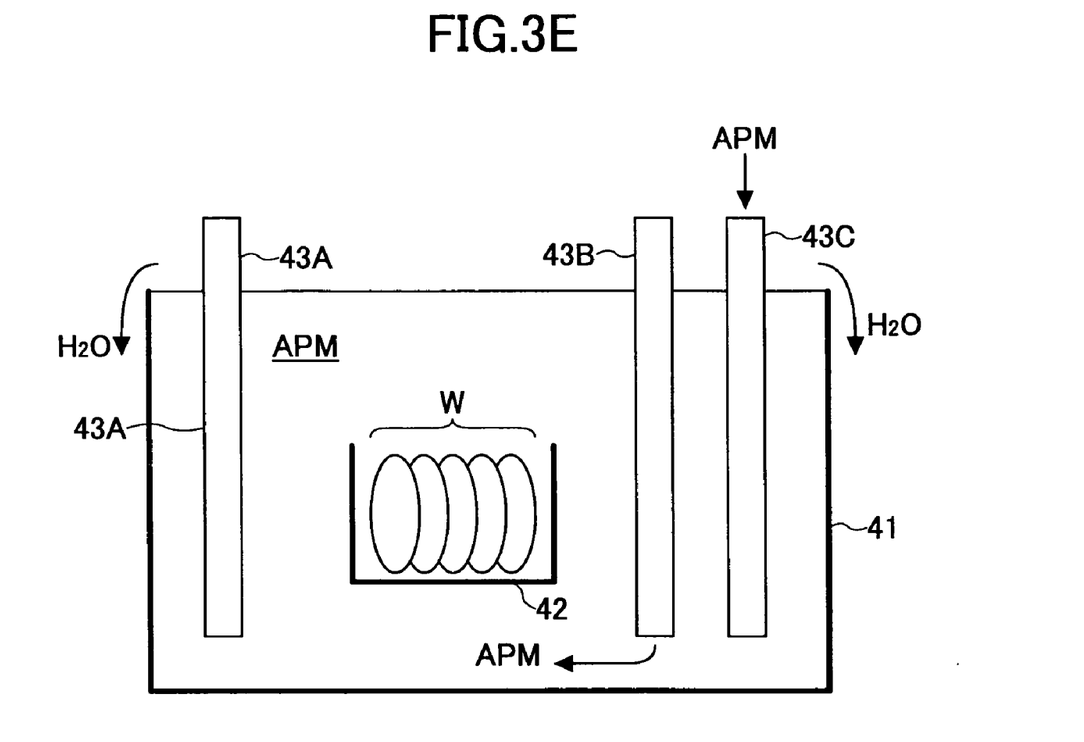

Further, in the step of FIG. 3E, the APM solution is again supplied to the wet processing bath 41 from another port 43C in the state that the container 42 and the wafer W are held in the bath 41, such that the purified in the water is purged from the bath 41 by causing overflowing.

Thereby, the liquid in the container 41 is replaced again with the APM aqueous solution, and with this, a chemical oxide film 24 is formed on the fresh silicon surface exposed in the step of FIG. 3C at the diffusion regions 21a and 21b and at the polysilicon gate electrode 23, with a uniform thickness of 0.5–0.6 nm. It should be noted that the wet process of FIG. 3E is conducted at a temperature equal to or higher than the room temperature, preferably at the temperature of 60–80° C. for ten minutes, similarly to the process of FIG. 3A. Thereby, the ratio of ammonia and hydrogen fluoric acid is set typically 1:1.

It should be noted that the foregoing thickness of 0.5–0.6 nm of the chemical oxide film 24 thus formed does not change substantially even when the duration of immersion in the step of FIG. 3E is increased, while this suggests that there is caused a self-limiting phenomenon at the foregoing particular thickness. Thus, even when there exists some initial non-uniformity in the thickness of the chemical oxide 24 at the beginning of the immersion step of FIG. 3E, the thickness of the chemical oxide film 24 eventually converges to the foregoing thickness similarly in the part where the film thickness is large and also in the part where the film thickness is small. Thereby, the non-uniformity of the film thickness is eliminated.

Figure 2E:
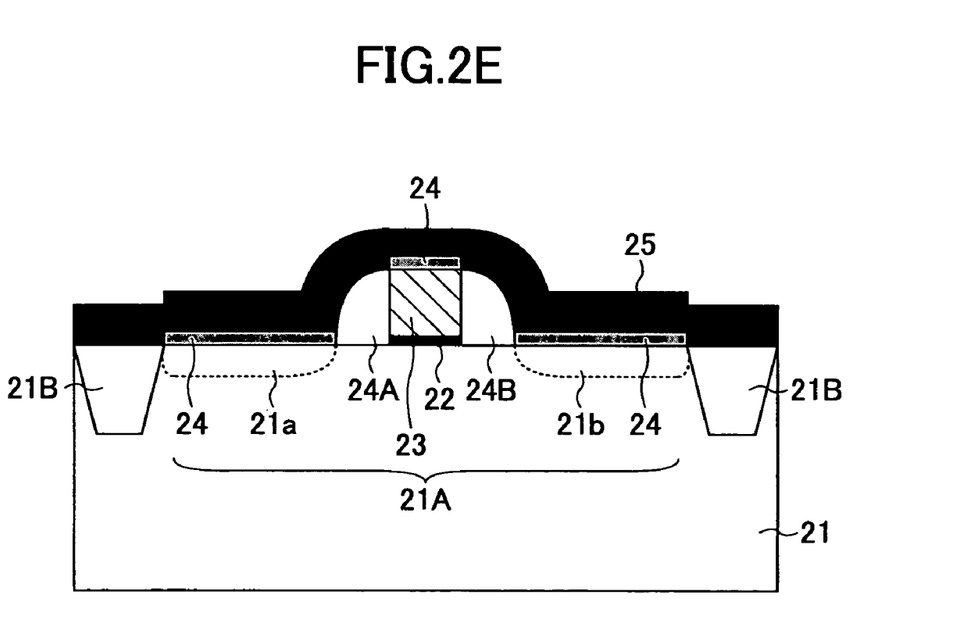

After the step of FIG. 3E, the silicon substrate 21 having the structure of FIG. 2D is introduced, after drying process, into a sputtering apparatus not illustrated, and a metal film 25 of cobalt (Co) or nickel (Ni) is deposited by a sputtering process so as to cover the chemical oxide film 24 as showing in FIG. 2E. Further, while not illustrated, a cap layer of TiN is deposited on the metal film 24 subsequently and continuously by a sputtering process.

Thereby, it should be noted that the surface of the diffusion regions 21a and 21b or the surface of the polysilicon gate electrode 23 is covered with the chemical oxide film 24, and thus, there is caused no formation of non-uniform native oxide film anymore even in the case such a drying process or transportation process to the vacuum evaporation deposition apparatus is conducted in the atmospheric ambient. Thus, with the present invention, the problem of FIG. 1 is resolved.

Figure 2F:
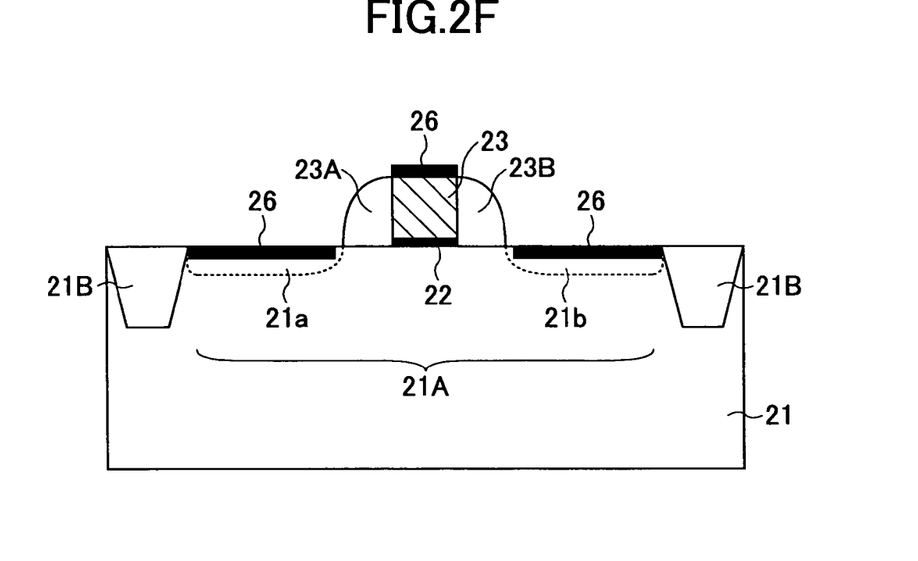

Next, in the step of FIG. 2F, the structure of FIG. 2E is annealed in a nitrogen ambient at the temperature of about 500° C. for 30 seconds, wherein the metal atoms in the metal film 25 cause diffusion into the diffusion regions 21a and 21b and also to the gate electrode 23 via the chemical oxide film 23. Thereby, there occurs self-alignment formation of a silicide film 26 on the surface of the diffusion regions 21a and 21b and also on the surface of the polysilicon gate electrode 23.

In the step of FIG. 2F, it should be noted that the oxygen atoms constituting the chemical oxide film 24 cause diffusion into the metal film 25 and are absorbed therein. Because the chemical oxide film 24 is an extremely thin film having the thickness of only 0.5–0.6 nm (about one molecular layer of $SiO_2$), the oxygen atoms constituting the chemical oxide film 24 are absorbed by the metal film 25 without problem. Thus, the thin chemical oxide film 24 does not cause any problem at the time of the silicide forming reaction.

Further, in the step of FIG. 2F, the TiN cap film and the unreacted metal film 25 remaining after the silicide formation process are removed by a wet etching process while using an aqueous solution of the APM solution, sulfuric acid and hydrogen peroxide as an etchant.

Particularly, in the case the metal film 25 is a Co film and the silicide layer 26 is formed of cobalt silicide, a further thermal annealing process is conducted after the removal of the metal film 25 at the temperature of about 800° C. for 30 seconds. Thereby, the silicide layer 26 is converted from cobalt monosiliside (CoSi) to cobalt disilicide ($CoSi_2$) characterized by a further low resistance. In the case the metal film 25 is a nickel film, an optimal thermal annealing process may be conducted at 500° C. for 30 seconds.

Further, a similar process may be conducted also for a p-channel MOS transistor formed on the same silicon substrate 21.

Figure 2G:
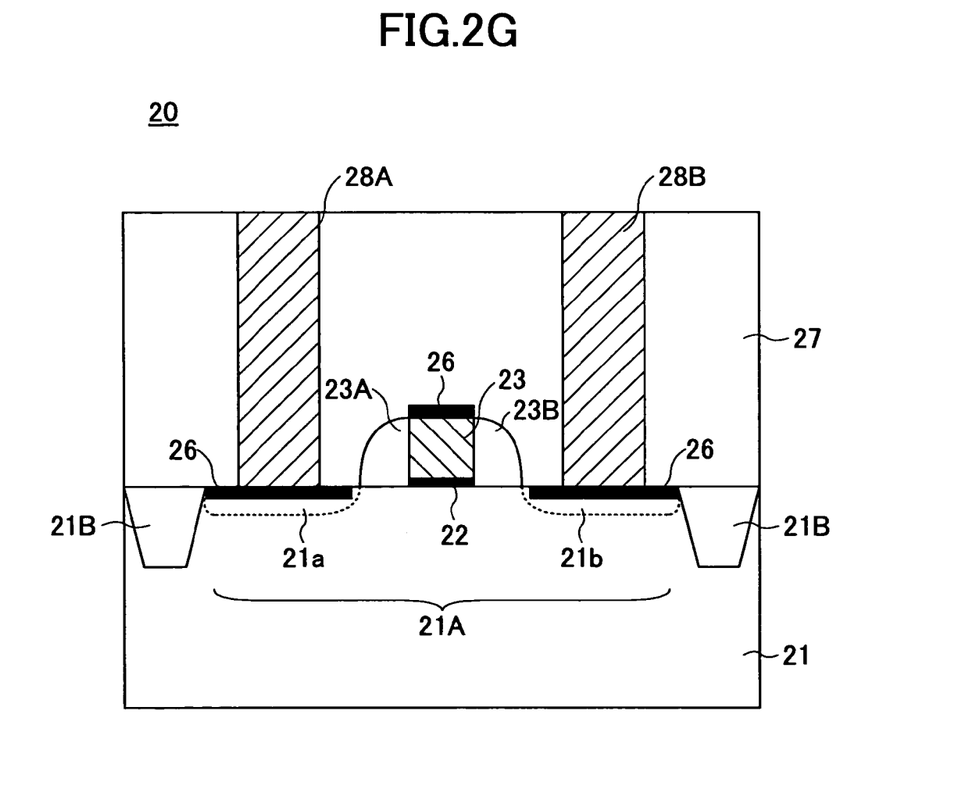

Further, in the step of FIG. 2G, there is formed an insulation film 27 on the silicon substrate 21 so as to cover the gate electrode 23, and contact plugs 28A and 28B are formed in the insulation film 27b so as to make a contact respectively with the diffusion regions 21a and 21b via the silicide layer 26.

Figure 4:
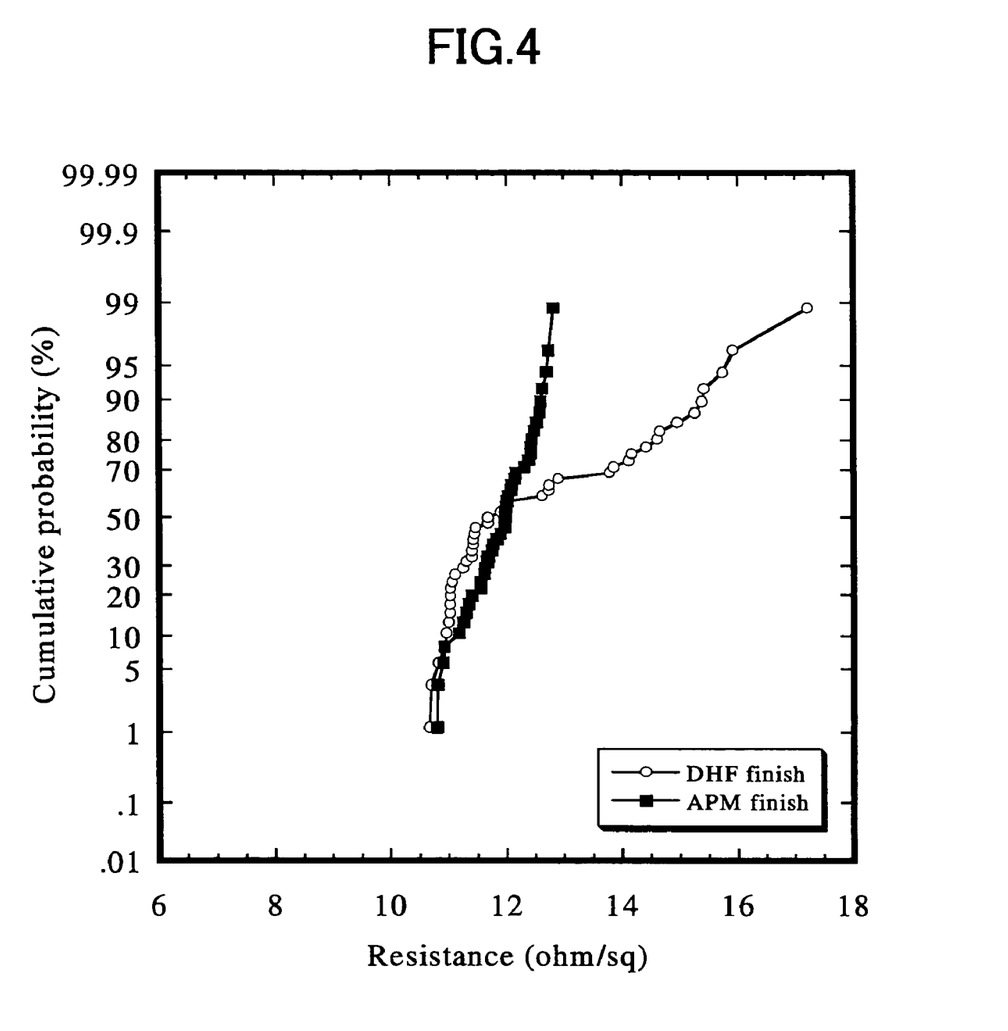
FIG. 4 is a diagram showing the sheet resistance of the n-channel MOS transistor formed with the method of the present invention.

FIG. 4 shows the distribution of sheet resistance of the wiring in the n-channel MOS transistor of FIG. 2G thus formed, wherein the horizontal axis represents the sheet resistance while the vertical axis represents the accumulated probability. Further, the solid squares in the drawing represent the result for the n-channel MOS transistor of FIG. 2G fabricated via the step of FIG. 3E, while the open circles represent the result for the n-channel MOS transistor in which the process of FIG. 3E is omitted.

Referring to FIG. 4, it can be seen that the sheet resistance falls mostly within the range of 10–12 Ω/sq for the transistor of the present invention, while in the case of the n-channel MOS transistor formed by the conventional process, there is caused an overall increase of the sheet resistance and that there appears a very large variation in the value of the sheet resistance. It is believed that the increased variation and increased value of the wiring resistance observed in the n-channel MOS transistor formed by the conventional process is thought as being caused by the formation of non-uniform oxide film 14x explained with reference to FIG. 1.

Figure 5:
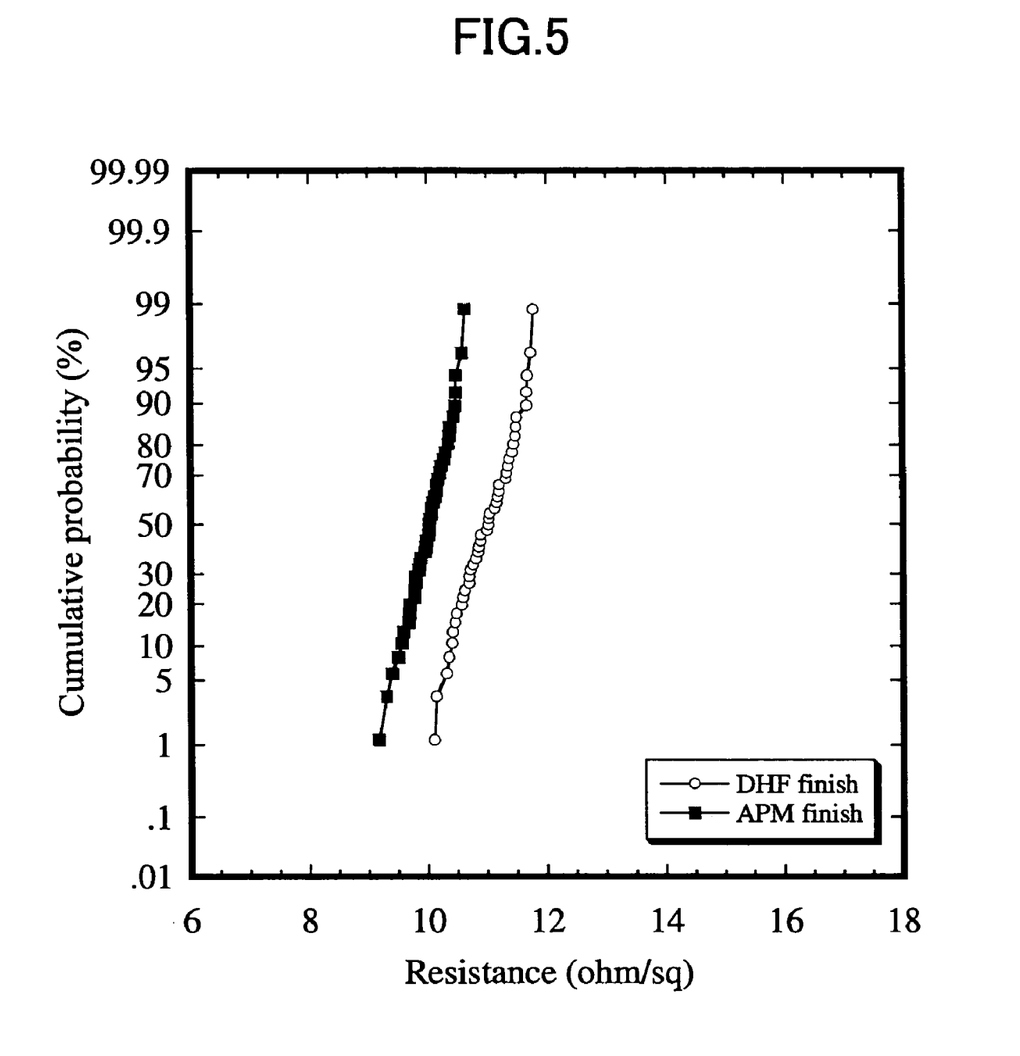
FIG. 5 is a diagram showing the sheet resistance of a p-channel MOS transistor formed with the method of the present invention.

FIG. 5 shows the distribution of sheet resistance of the wiring in the p-channel MOS transistor formed according to the process of FIGS. 2A–2G, wherein the horizontal axis represents the sheet resistance while the vertical axis represents the accumulated probability. In FIG. 5, solid squares represent the result for the p-channel MOS transistor 20 of FIG. 2G fabricated via the process of FIG. 3E, while the open circles represent the result for the n-channel MOS transistor fabricated according to the conventional process that omits the process of FIG. 3E.

Referring to FIG. 5, it can be seen that the variation of the sheet resistance is smaller in the p-channel MOS transistor even in the case the p-channel MOS transistor is formed by the conventional process, wherein it is noted also that the value of the sheet resistance can be reduced further by employing the fabrication process of the present invention.

Figure 6:
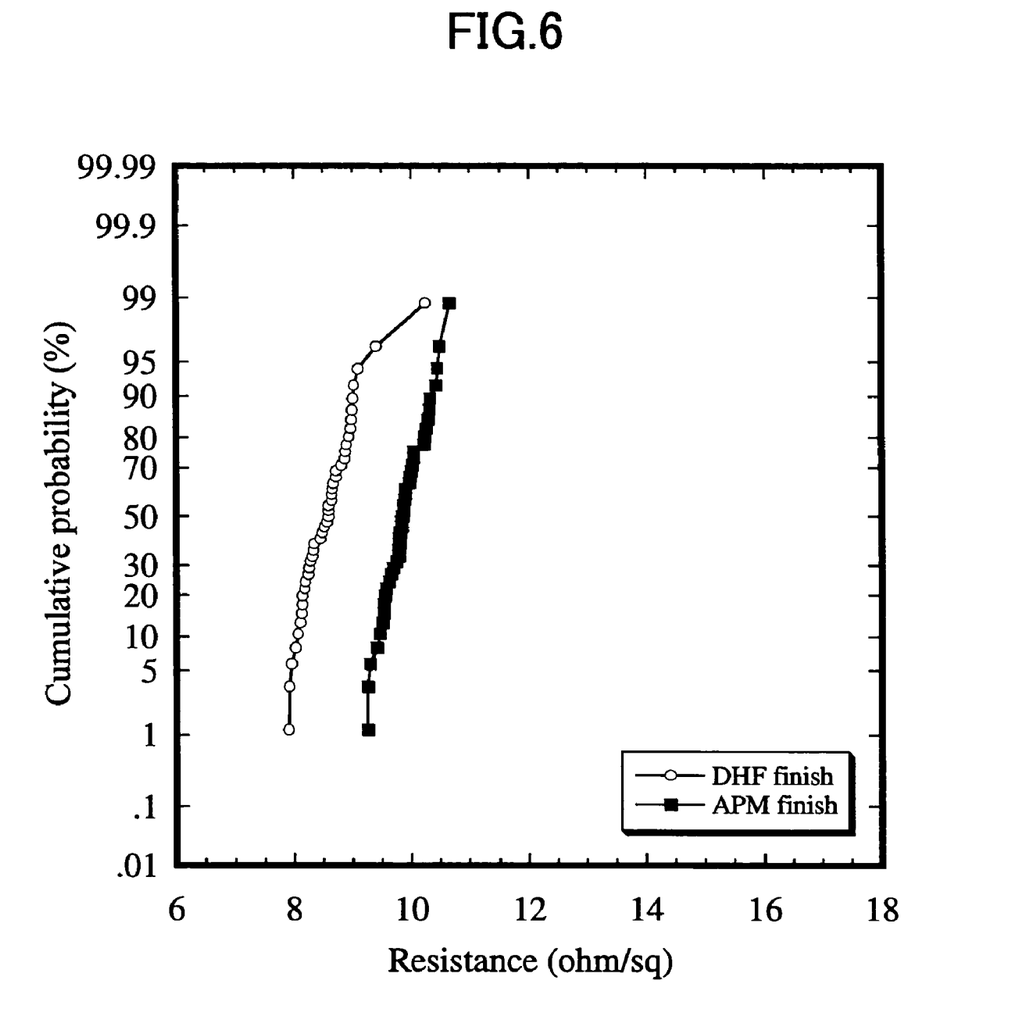
FIG. 6 is a diagram showing the sheet resistance of a non-doped semiconductor structure formed with the method of the present invention.

FIG. 6 shows the distribution of sheet resistance of the wiring in the case the structure of FIG. 2G is formed without doping the diffusion regions 21a and 21b and the gate electrode 23. Similarly to the case of FIG. 4, the horizontal axis represents the sheet resistance while the vertical axis represents the accumulated probability. In the drawing, the solid circles represent the result for the structure of FIG. 2G formed via the process of FIG. 3E, while the open circles represent the result for the structure of FIG. 2G formed by the conventional process that omits the process of FIG. 3E. In any of these structures, doping of the diffusion regions 21a and 21b or the gate electrode 23 is not made.

Referring to FIG. 6, it can be seen that, in the case the foregoing doping is not made, the value of the wiring resistance for the conventional process is decreased as compared with the present embodiment that uses the process of FIG. 3E, when the native oxide film is removed by conducting the diluted hydrofluoric acid treatment. It should be noted that this result reflects the situation that the exposed silicon surface is terminated successfully by hydrogen.

Further, FIG. 6 shows also that the variation of the wiring resistance is generally equal or slightly smaller in the case the process of the present embodiment is conducted. Of course, however, it is not possible to form an active semiconductor device in the specimen of FIG. 6 that lacks doping.

As described heretofore, the present invention forms the silicide layer on the diffusion regions forming the source and drain regions of the MOS transistor or on the polysilicon gate electrode, by removing the native oxide film in the step of FIG. 3C and then by forming a chemical oxide film in the step of FIG. 3E. Thereby, the chemically active surface of the diffusion regions 21a and 21b and also of the polysilicon gate electrode 23 are covered by the stable chemical oxide film 24, and as a result, non-uniform formation of native oxide film 14x explained with reference to FIG. 1 is effectively suppressed, even when the silicon wafer finished with the process of FIG. 3E is taken out into the atmospheric ambient.

Thus, according to the present invention, it becomes possible to store the silicon wafer W finished with the process of FIG. 3E for a prolonged duration. Further, it becomes possible to transport the wafer thus processed to the user in the atmospheric ambient. Thereby, the surface of the diffusion regions 21a and 21b or the surface of the polysilicon gate electrode 23 can be stabilized further when the process of FIG. 2E of forming the metal film 25 is conducted.

The present invention is particularly effective in ultra-high-speed semiconductor devices having a gate length of 90 nm or less, such as the one having the gate length of 50 nm or 40 nm. While not illustrated, such a ultrahigh-speed semiconductor device includes a CMOS device in which an n-channel MOS transistor and a p-channel MOS transistor are connected in series. Further, the present invention also includes semiconductor memory devices that use such minute MOS transistors.

Further, the present invention is not limited to the embodiments described heretofore, but various variations and modifications may be made without departing from the scope of the invention.

What is claimed is:

1. A method of fabricating a semiconductor device including a self-aligned silicide formation process, comprising the steps of:

forming a device structure including a polysilicon gate electrode and a diffusion region on a silicon substrate;

depositing a metal film on said silicon substrate so as to cover said polysilicon gate electrode and said diffusion region;

forming a silicide layer by causing a reaction between a surface of said polysilicon gate electrode and said metal film and between a surface of said diffusion region and said metal film; and removing said metal film after said step of forming said silicide layer;

wherein there is provided, before said deposition step of said metal film, the step of removing a native oxide film from a surface of said polysilicon gate electrode and a surface of said diffusion region, and wherein there is provided, after said step of removing said native oxide film, the step of forming a chemical oxide film on said surface of said polysilicon gate electrode and said surface of said diffusion region.

2. The method as claimed in claim 1, wherein said step of removing said native oxide film and said step of forming said chemical oxide film are conducted continuously in a liquid.

3. The method as claimed in claim 1, wherein said chemical oxide film is formed in an aqueous solution of ammonia and hydrogen peroxide at a temperature of room temperature or higher.

4. The method as claimed in claim 3, wherein said step of removing said native oxide film is conducted in a vessel filled with a hydrofluoric acid solution therein, and wherein said step of forming said chemical oxide film includes the step of replacing said hydrofluoric acid solution with said aqueous solution of ammonia and hydrogen peroxide while maintaining a state in which said vessel is filled with a liquid.

5. The method as claimed in claim 1, wherein said semiconductor device has a gate length of 90 nm or less.

* * * * *